United States Patent
Kang (10) Patent No.: US 9,385,270 B2
(45) Date of Patent: Jul. 5, 2016

(54) LIGHT-EMITTING DEVICE AND LIGHT-EMITTING DEVICE PACKAGE

(71) Applicant: LG INNOTEK CO., LTD., Seoul (KR)

(72) Inventor: Hyun Oh Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/433,361

(22) PCT Filed: Oct. 2, 2013

(86) PCT No.: PCT/KR2013/008842
§ 371 (c)(1),
(2) Date: Apr. 2, 2015

(87) PCT Pub. No.: WO2014/054891
PCT Pub. Date: Apr. 10, 2014

(65) Prior Publication Data
US 2015/0280059 A1    Oct. 1, 2015

(30) Foreign Application Priority Data

Oct. 2, 2012  (KR) .................... 10-2012-0109723

(51) Int. Cl.
| H01L 29/06 | (2006.01) |
| H01L 33/06 | (2010.01) |
| H01L 33/32 | (2010.01) |
| H01L 33/00 | (2010.01) |
| H01L 33/12 | (2010.01) |
| H01L 33/14 | (2010.01) |

(52) U.S. Cl.
CPC ............ *H01L 33/06* (2013.01); *H01L 33/0025* (2013.01); *H01L 33/12* (2013.01); *H01L 33/32* (2013.01); *H01L 33/145* (2013.01); *H01L 2224/48091* (2013.01)

(58) Field of Classification Search
CPC ........ H01L 33/06; H01L 33/12; H01L 33/145
USPC .......................................................... 257/13
See application file for complete search history.

(56) References Cited

U.S. PATENT DOCUMENTS

| 2008/0315243 A1 | 12/2008 | Ueno et al. |
| 2010/0133506 A1 | 6/2010 | Nakanishi et al. |
| 2011/0089452 A1 | 4/2011 | Jeong et al. |

FOREIGN PATENT DOCUMENTS

| JP | 2001-94216 A | 4/2001 |
| JP | 2009-4569 A | 1/2009 |
| JP | 2010-87038 A | 4/2010 |
| KR | 10-2010-0023960 A | 3/2010 |
| KR | 10-2011-0041272 A | 4/2011 |

*Primary Examiner* — Douglas Menz
(74) *Attorney, Agent, or Firm* — Birch, Stewart, Kolasch & Birch, LLP (57) ABSTRACT

A light-emitting device, according to one embodiment of the present invention, comprises: a first conductive semiconductor layer; an active layer on the first conductive semiconductor layer; a blocking layer on the active layer; and a second conductive semiconductor layer on the blocking layer, wherein the active layer comprises a plurality of quantum well layers and quantum barrier layers, and the quantum well layer is formed from $In_xGa_yNIn_xGa_yN$ ($0.11 \leq x \leq 0.14$, $0 < x+y \leq 1$).

19 Claims, 7 Drawing Sheets

LIGHT-EMITTING DEVICE AND LIGHT-EMITTING DEVICE PACKAGE

TECHNICAL FIELD

The present invention relates to a light-emitting device, a method of fabricating the light-emitting device, a light-emitting device package, and a lighting system.

BACKGROUND ART

A light-emitting device includes a compound semiconductor having a characteristic of converting electrical energy into light energy. The light-emitting device may include compound semiconductors belonging to group III and V on the periodic table. The light-emitting device can represent various colors hv adjusting the compositional ratio of the compound semiconductors.

When forward voltage is applied to the light-emitting device, electrons of an N layer are combined with holes of a P layer, so that energy may be diverged corresponding to an energy gap between a conduction band and a valance band. The energy is mainly emitted in the form of heat or light, In the case of the light-emitting device, the energy is diverged in the form of light.

For example, a nitride semiconductor represents superior thermal stability and wide bandgap energy so that the nitride semiconductor has been spotlighted in the field of optical devices and high-power electronic devices. In particular, blue, green, and ultraviolet (UV) light-emitting devices employing the nitride semiconductor have already been commercialized and extensively used.

Figure 1:
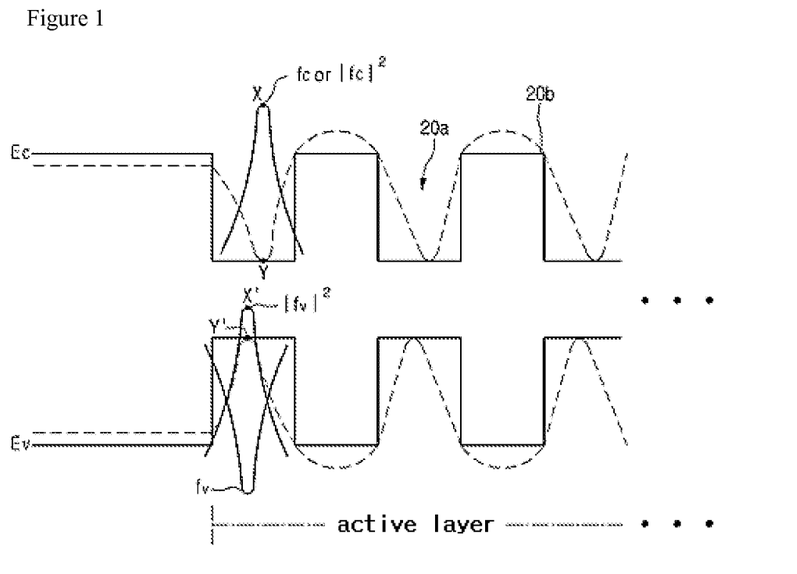
FIG. 1 is a view showing an energy band for an active layer of a light-emitting device according to the related art.
Figure 2:
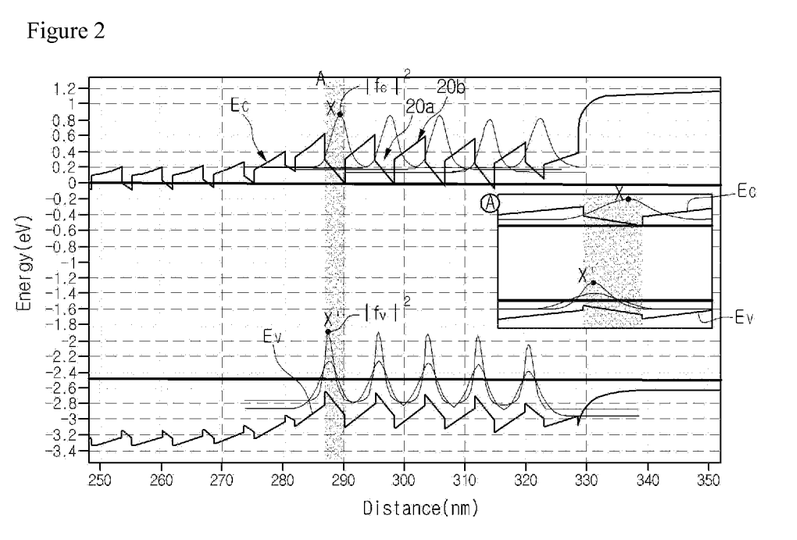
FIG. 2 is an energy band diagram obtained by simulating the active layer of the light-emitting device shown in FIG. 1.

FIG. 1 is a view showing an energy band for an active layer of a light-emitting device according to the related art, and FIG, 2 is an energy band diagram obtained by simulating the active layer of the light-emitting device shown in FIG. 1.

Referring to FIGS. 1 and 2, according to the related art, the active layer may include a plurality of quantum well layers $20a$ and a plurality of quantum barrier layers $20b$. The quantum well layers $20a$ and the quantum barrier layers $20b$ may be formed of a semiconductor compound such as InGaN/InGaN.

In general, the energy band of the active layer is divided into a conductive band and a valence band. A conductive band energy level Ec and a valance band energy level Ev are formed while facing each other and have lower values in the quantum well layers $20a$ and higher values in the quantum barrier layers $20b$.

As shown in the drawing, the conductive band energy level Ec and the valance band energy level Ev in the active layer substantially have energy band waveforms as shown in dotted lines (--). The energy band waveforms are determined by wave functions fc and fv of holes and electrons, which are determined in the quantum well layer $20a$ and the quantum barrier layer $20b$, respectively.

However, a strong piezoelectric field is formed in the quantum well layer $20a$ formed of InGaN due to the stress resulting from an asymmetry and a lattice constant mismatch of a Wurzite structure and. The strong piezoelectric field biases the wave functions fc and fv of holes and electrons to significantly reduce transition probability.

As shown in drawings, the wave functions fc and fv of the conductive band and the valance band facing the conductive band in the quantum well layer $20a$ of the active layer are biased to the quantum barrier layer $20b$ (regions X and X' are biased in directions opposite to each other).

In an enlarged view of a region A of FIG. 2, the region X of the wave funcation fc at the conductive band and the region X' of the wave function fv at the valance band are not mismatched with each other in a vertical direction and biased to right and left sides, respectively.

As the wave functions fc and fv are biased, the energy band waveform Ec at the conductive band and the energy band waveform Ev at the valance band are based to space electrons and holes collected in the quantum well layer $20a$ away from each other (regions Y and Y' are biased in the directions opposite to each other).

In particular, square roots of absolute values of wave functions fc and fv in the quantum well layer are expressed as $|fc|^2$ and $|fv|^2$, respectively, which refer to probability density functions of holes and electrons ire the quantum well layer, respectively. The probability density functions refer to densities at which the electrons and the holes exist in the conductive band and the valance band, respectively. The regions having the highest probability density are spaced apart from each other to reduce transition probability (coupling probability) of holes and electrons, so that internal quantum efficiency (IQE) is degraded.

DISCLOSURE

Technical Problem

The embodiment provides a light-emitting device, capable improving quantum efficiency at the high current density by superimposing wave functions of electrons and holes, which exist at a conductive band and a valance band in a quantum well layer while facing each other, with each other, a method of fabricating the light-emitting device, a light-emitting device package, and a lighting system.

Technical Solution

According to the embodiment, there is provided a light-emitting device including a first conductive semiconductor layer, an active layer on the first conductive semiconductor layer, a blocking layer on the active layer, and a second conductive semiconductor layer on the blocking layer. The active layer includes a plurality of quantum well layers and a plurality of quantum barrier layers, and each quantum well layer includes $In_xGa_yNIn_xGa_yN$ ($0.11 \leq x \leq 0.14$, $0 < x+y \leq 1$).

In addition, according to the embodiment, there is provided a light-emitting device including a light emitting structure including a light emitting structure including a second conductive semiconductor layer, a blocking layer on the second conductive semiconductor layer, an active layer on the blocking layer, and a first conductive semiconductor layer on the active layer, a first electrode on the light emitting structure, and a second electrode under the light emitting structure. The active layer includes a plurality of quantum well layers and a plurality of quantum barrier layers, the quantum well layer has a lower conductive energy band and a lower valance energy band facing each other, the quantum barrier layer has a higher conductive energy band and a higher valance energy band facing each other, and a wave function of a conducive band and a wave function of a valance band are superimposed with each other in each of the quantum well layer and the quantum barrier layer.

According to the embodiment, there is provided a light-emitting device package including a body, a light-emitting device on the body, and first and second lead electrodes electrically connected with the light-emitting device. The light-emitting device includes a first conductive semiconductor layer, an active layer on the first conductive semiconductor layer, a blocking layer on the active layer, and a second conductive semiconductor layer on the blocking layer. The active layer includes a plurality of quantum well layers and a plurality of quantum barrier layers, and each quantum well layer includes $In_xGa_yNIn_xGa_yN$ ($0.11 \leq x \leq 0.14$, $0 < x+y \leq 1$).

Advantageous Effects

According to the embodiment, in the light-emitting device, the method of fabricating the same, the light-emitting device package, and the lighting system, quantum efficiency can be improved at the high current density by superimposing wave functions of the electrons and the holes, which exist at the conductive band and the valance band in a quantum well layer while facing each other, with each other.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the d awings.

Hereinafter, a light-emitting device, a method of fabricating the light-emitting device, a light-emitting device package, and a lighting system will be described in detail with reference to accompanying drawings.

Figure 3:
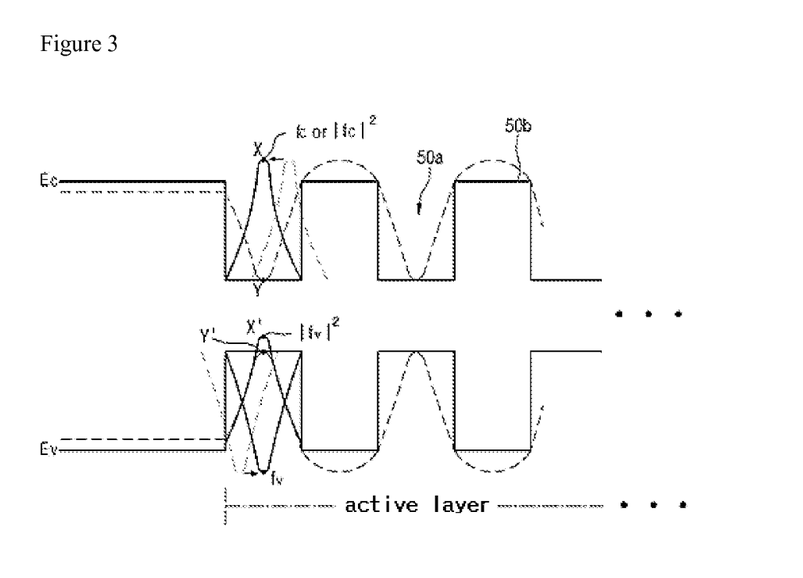
FIG. 3 is a view showing an energy band for an active layer of a light-emitting device according to the embodiment.
Figure 4:
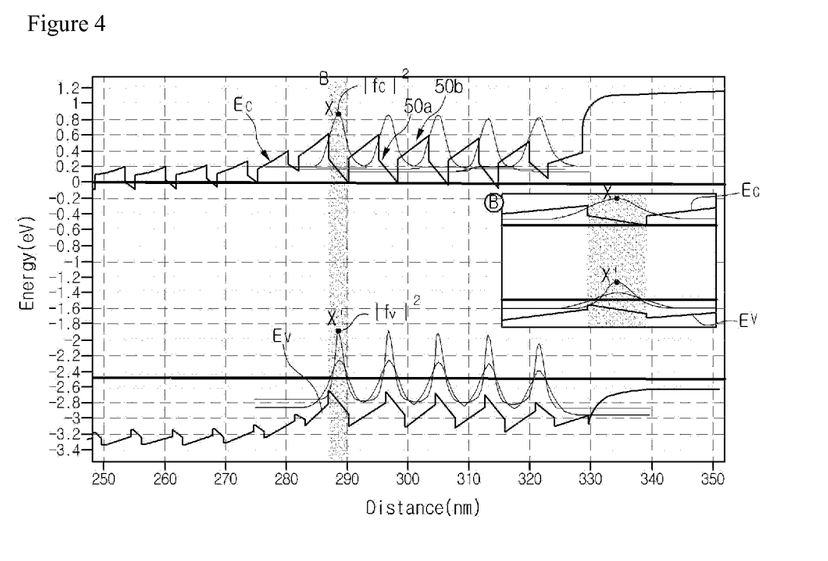
FIG. 4 is an energy band diagram obtained by simulating the active layer of the light-emitting device shown in FIG. 3.

FIG. 3 is a view showing an energy band for an active layer of the light-emitting device according to the embodiment, and FIG. 4 is an energy band diagram obtained by simulating the active layer of the light-emitting device shown in FIG. 3.

Referring to FIGS. 3 and 4, the active layer of the light-emitting device according to the embodiment may be realized using a compound semiconductor. For example, the active layer may be realized using a group II-VI or group III-V compound semiconductor. For example, the active layer may be realized using a semiconductor material having a compositional formula of $In_xAl_yGa_{1-x-y}N$ ($0 \leq x \leq 1$, $0 \leq y \leq 1$, $0 \leq x+y \leq 1$). When the active layer is realized in a multi-well structure, the active layer may be realized by laminating a plurality of quantum well layers 50a and a plurality of quantum well layers 50b. For example, the active layer may be realized in the cycle of InGaN well/GaN barrier layers, InGaN well/InGaN barrier layers, and InGaN well/InAlGaN barrier layers.

The energy band of the active layer is divided into a conductive band and a valance band, and a conductive band energy level Ec and a valance band energy level Ev have lower values in a quantum well layer 50a and have higher values in a quantum barrier layer 50b.

As shown in drawings, the conductive baud energy level Ec and the valance band energy level Ev of the active layer are actually represented in the energy band waveforms as shown in a dotted line. The energy band waveforms are formed by wave functions fc and fv of holes and electrons in the quantum well layer 50a and the quantum barrier layer 50b.

As described with reference FIGS. 1 and 2, in the quantum well layer 20a. including InGaN, wave functions fc and fv of holes and electrons are biased due to a strong internal piezoelectric field, so that the transition probability can be significantly reduced.

However, according to the embodiment, the content of indium (In) is adjusted under the condition of $In_xGa_yN$ ($0.11 \leq x \leq 0.14$, $0 < x+y \leq 1$) in the quantum well layer 50a including InGaN, so that the wave functions fc and fv facing each other and including the regions haying the highest existence probabilities of the electron and the hole, respectively, in the quantum well layer 50a can be superimposed with each other at the center of the quantum well layer 50a. In other words, the wave functions of fc and fv of the quantum barrier layer 50a biased to the quantum barrier layer 50b are shifted to the center of the quantum well layer 50a by adjusting the content of In contained in the quantum well layer 50a to a value in the range of 0.11 to 0.14. Accordingly, the quantum barrier layer 50a according to the embodiment may be formed of $In_{0.11-14}GaN$.

As shown in drawings, the wave functions fc and fv of the conductive band and the valance band in the quantum well layer 50a of the active layer are shifted to the center of the quantum well layer 50a. from existing wave functions (marked in a dotted line) according to the adjustment of the content of In.

Therefore, the central vertex (X; a region having the highest probability at which electrons exist) of the wave function fc of the conductive band or a probability density function $|fc|_2$, which is expressed as the square root of the absolute value of the wave function fc, and the central vertex (X': a region having the highest probability at which holes exist) of the wave function fv of the valance band or a probability density function $|fv|_2$, which is expressed as the square root of the absolute value of the wave function fv, are superimposed with each other in a vertical direction at the center of the quantum well layer 50a.

In addition, a lower vertex Y of an energy band waveform at the conductive band and a higher vertex Y' of an energy band waveform at the valance band are superimposed with each other in a vertical direction at the center of the quantum well layer 50a.

In other words, according to the embodiment, since the conductive energy band is superimposed with the valance energy band at the closest position, the transition probability is increased, so that the coupling probability between the holes and the electrons is increased. As described above, as the coupling probability between the holes and the electrons is increased, the internal quantum efficiency of the light-emitting device can be improved.

In other words, the regions having the highest existence probability of electrons or holes are positioned with an energy bandgap Eg having the shortest distance, so that the coupling probability between the electrons and the holes can be increased.

When viewed in an enlarged view of a region B in FIG. 4, the region X of the wave function fc or the probability density function $|fc|^2$ at the conductive band is superimposed with the region X' of the wave function fv or the probability density function $|fv|^2$ at the valance band in the vertical direction.

In other words, according to the embodiment, the content of indium (In) in InGaN of the quantum well layer 50a is adjusted to a value in the range of 0.11~0.14, so that the wave functions fc and fv biased to a quantum barrier layer in a conventional active layer as shown in FIG. 2 are shifted to the center of a quantum well layer, thereby increasing the coupling probability between holes existing at the valance band and electrons existing at the conductive band in the quantum well layer 50a.

In addition, according to the embodiment, when the quantum barrier layer 50b includes $In_xAl_yGa_{1-x-y}N$, the content of Al is adjusted under the condition of $0 \le x \le 1$, $0 \le y \le 0.005$, and $0 \le x+y \le 1$, so that an undulating energy band slope may be formed in the quantum barrier layer 50b. In other words, as the content of Al is adjusted, an energy band is heightened by a predetermined height to form the undulating energy band skip, even though an energy band slop has a flat shape according to the related art, at the boundary between the quantum well layer 50a and the quantum barrier layer 50b. As described above, if the undulating energy band waveform is formed, more many electrons or holes can be collected in the quantum well layer 50a. In addition, when the electrons and the holes are coupled to each other in the quantum well layer 50a, thereby preventing electrons or holes from deviating from the quantum well layer 50a to an adjacent quantum barrier layer 50b.

In addition, if more many electrons and holes are collected in the quantum well layer 50a, the energy band at the conductive band is close to the energy band at the valance band as much as possible by adjusting the content of indium (In) as described above. Accordingly, the coupling efficiency between the electrons and the holes can be improved.

Figure 5:
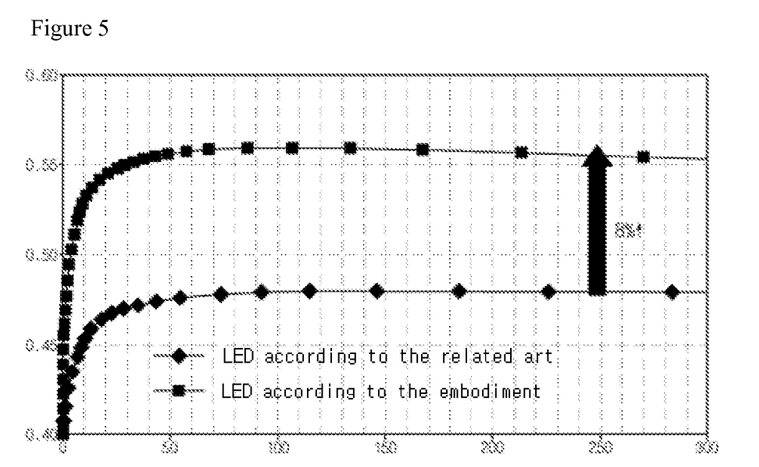
FIG. 5 is a graph showing the comparison between the light-emitting device according to the embodiment and the light-emitting device according to the related art in terms of internal quantum efficiency (IQE).

FIG. 5 is a graph showing the comparison between the light-emitting device according to the embodiment and the light-emitting device according to the related art in terms of internal quantum efficiency (IQE).

Referring to drawings, the IQE of a light-emitting device (LED: -♦-) in which the content of In contained in a quantum well layer of an active layer is not adjusted according to the related art is compared with the IQE of a light-emitting device (LED: -■-) according to the embodiment in which the content of In contained in a quantum well layer of an active layer is adjusted in the range of $In_{0.11-0.14}GaN$. According to the embodiment, the IQE of the LED is increased, and a droop phenomenon in which the IQE is reduced even at a high current region can be significantly improved.

Figure 6:
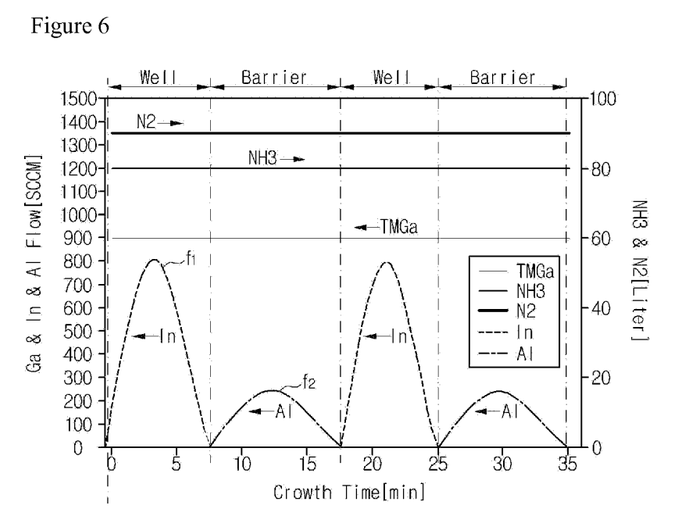
FIG. 6 is a graph showing a moving direction of a wave function according to the flow rate of Ga/In/Al in the fabrication process of the light-emitting device according to the embodiment.

FIG. 6 is a graph showing a moving direction of a wave function according to the flow rate of Ga/In/Al in the fabrication process of the light-emitting device according to the embodiment.

Referring to drawings, a wave function f1 of a well layer is shifted leftward according to the content of indium (In) in a quantum well layer, and a wave function f2 of a barrier layer is shifted leftward according to the content of aluminum (Al) in a quantum barrier layer.

In addition, when growing the active layer in the light-emitting device, the wave functions f1 and f2 of the quantum well layer and the quantum barrier layer are shifted leftward or rightward according to the flow rate of the nitrogen ($N_2$), ammonia ($NH_3$), and tri-metal gallium (TMGa) introduced into a chamber.

According to the embodiment, the flow rate of indium (In) in the quantum well layer and the flow rate of aluminum (Al) in the quantum barrier layer are adjusted to a value in the range of 0.11 to 0.14 and 0 to 0.05, respectively, to adjust the positions of the wave functions f1 and f2 so that the electron density region at the conductive band is made closely to the hole density region at the variance band. Accordingly, the coupling efficiency can be improved.

Figure 7:
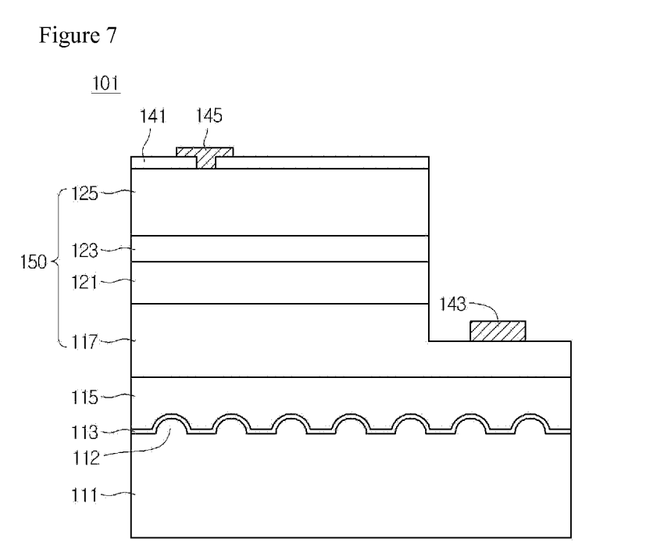
FIG. 7 is a sectional view showing a lateral-type light-emitting device according to the embodiment.

FIG. 7 is a sectional view showing a vertical-type light-emitting device according to the embodiment.

Referring to the drawing, in a light-emitting device 101 according to the embodiment, an electrode layer 141 and a second electrode 145 are formed on a light emitting structure 150. A first electrode 143 is formed on a first conductive semiconductor layer 117. The light emitting structure 150 may include the first conductive semiconductor layer 117, an active layer 121, an electron blocking layer (EBL) 123, and a second conductive semiconductor layer 125.

In addition, a low conductive layer 115, a buffer layer 113, and a substrate 111 are laminated under the light emitting structure 150. A plurality of protrusions 112 are formed on a top surface: of the substrate 111. The protrusions 112 are formed when the substrate 111 is etched or an additional light extraction structure such as roughness is formed, The protrusion 112 may have a stripe shape, a semi-spherical shape, or a dome shape.

The substrate 111 may employ a transmissive substrate, an insulating substrate, or a conductive substrate. For example, the substrate 111 may include at least one of sapphire ($Al_2O_3$), SiC, Si, GaAs, GaN, ZnO, Si, GaP, InP, Ge, $Ga_2O_3$, and $LiGaO_3$.

The buffer layer 113 includes a semiconductor layer employing a group III-V compound semiconductor. For example, the buffer layer 113 includes a compositional formula of $In_xAl_yGa_{1-x-y}N$ ($0 \le x \le 1$, $0 \le y \le 1$, $0 \le x+y \le 1$), and includes at least one of compound semiconductors such as GaN, InN, AlN, InGaN, AlGaN, InAlGaN, and AlInN. The buffer layer 113 may have a superlattice structure by alternately arranging mutually different semiconductor lavers.

The buffer layer 113 may be formed to reduce the difference in a lattice constant between the substrate 111 and a nitride-based semiconductor layer, and may serve as a defect control layer. The buffer layer 113 may have an intermediate value between the lattice constant of the substrate 111 and the lattice constant of the nitride-based semiconductor layer. The buffer layer 113 may be formed of an oxide such as a ZnO layer, but the embodiment is not limited thereto. The buffer layer 113 may have a lattice constant between 30 nm to 500 nm, but the embodiment is not limited thereto.

The low conductive layer 115 is formed on the buffer layer 113. The low conductive layer 115 serves as an undoped semiconductor layer, and has electrical conductivity lower than that of the first conductive semiconductor layer 117. The conductive layer 115 may be realized as a GaN-based semiconductor using a group III-V compound semiconductor. Although the undoped semiconductor layer is not intentionally doped with conductive dopants, the undoped semiconductor layer has a first conductive characteristic. The undoped semiconductor layer may not be formed, but the embodiment cmbodhneutia not limited thereto. The low conductive layer 115 may be formed between a plurality of first conductive semiconductor layers 117.

The active layer 121 employs the active layer formed according to the embodiment described with reference to FIG. 3, For example, the first conductive semiconductor layer 117 may be formed of an N type semiconductor doped with N type dopants serving as first conductive dopants, and the second conductive semiconductor layer 125 may be formed of a P type semiconductor layer doped with P type dopants serving as second conductive dopants.

In addition, the first conductive semiconductor layer 117 may include a P type semiconductor layer, and the second conductive semiconductor layer 125 may include an N type semiconductor layer, For example, the first conductive semiconductor layer 117 may include N type semiconductor layer. The first conductive semiconductor layer 117 may be realized using a compound semiconductor. The first conductive semiconductor layer 117 may be realized using a group II-VI compound semiconductor, or a group compound semiconductor.

For example, the first conductive semiconductor layer 117 may be realized using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 117 may include one selected from the group consisting of GaN, AlGaN, InGaN, IiN, InAlGaN, AlInN, AlGaAs, GaP, GaAs, GaAsP, and AlGaInP doped with N type dopants such as Si, Ge, Sn, Se, and Te.

The active layer 121 emits light having a wavelength corresponding to the energy band gap difference according to materials constituting the active layer 121. through the combination of electrons (or holes) injected through the first conductive semiconductor layer 117 and holes (or electrons) injected through the second conductive semiconductor layer 125. The active layer 121 may have one of a single quantum well (SQW) structure, a multi-quantum well (MQW) structure, a quantum dot structure and a quantum wire structure, but the embodiment is not limited thereto.

The active layer 121 is formed using a material described with reference to FIG. 3.

For example, the second conductive semiconductor layer 125 may include a P type semiconductor layer. The second conductive semiconductor layer 125 may be implemented using a compound semiconductor.

For example, the second conductive semiconductor layer 125 may be implemented by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 125 may include one selected from the group consisting of GaN, AlN, AlGaN, InGaN, InN, InAlGaN, AlInN, AlGaAs, GaP, GaAs, GaAsP, and AlGaInP doped with P type dopants such as Mg, Zn, Ca, Sr, and Ba.

in addition, a first conductive InGaN/GaN superlattice structure or InGaN/InGaN superlattice structure may be formed between the first conductive semiconductor layer 117 and the active layer 121.

The EBL 123 may be provided for the effective transfer of holes and the effective confinement of electrons. For example, the EBL 123 may be realized using a second conductive AlGaN layer. For example, the EBL. 123 may be realized using a P type AlGaN layer.

The electrode layer 141 serves as a current spreading layer, and may be formed of a material having a transmittive property and electrical conductivity. The electrode layer 141 may have a refractive index lower than that of a compound semiconductor layer.

The electrode layer 141 may be formed on a top surface of the second conductive semiconductor layer 125. The electrode layer 141 may include a material selected from among indium tin oxide (ITO), indium zinc oxide (IW), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, and NiO, and may be formed in at least one layer. The electrode layer 141 may be formed of a reflective electrode layer. For example, the electrode layer 141 may a material selected from among Al, Ag, Pd, Rh, Pt, Ir, and the alloy of at least two of Al, Ag, Pd, Rh, Pt, and I.

The second electrode 145 may be formed on the second conductive semiconductor layer 125 and/or the electrode layer 141. The second electrode 145 may include an electrode pad. The second electrode 145 may have an arm-structure or finger-structure current spreading pattern.

The second electrode 145 may be formed of non-transmissive metal having a characteristic of an ohmic contact layer, an adhesive layer, or a bonding layer, but the embodiment is not limited thereto.

The first electrode 143 is formed at a portion of the first conductive semiconductor layer 117. The first electrode 143 and the second electrode 145 may include a material selected from among Ti, Ru, Rh, Ir, Mg, Zn, Al, In, Ta, Pd, Co, Ni, St, Ge, Ag, Au, and the alloy of a material selected from among Ti, Ru, Rh, Iv, Mg, Zn, Al, In, Ta, Pd, Co, Ni, Si, Ge, Ag, and Au.

Figure 8:
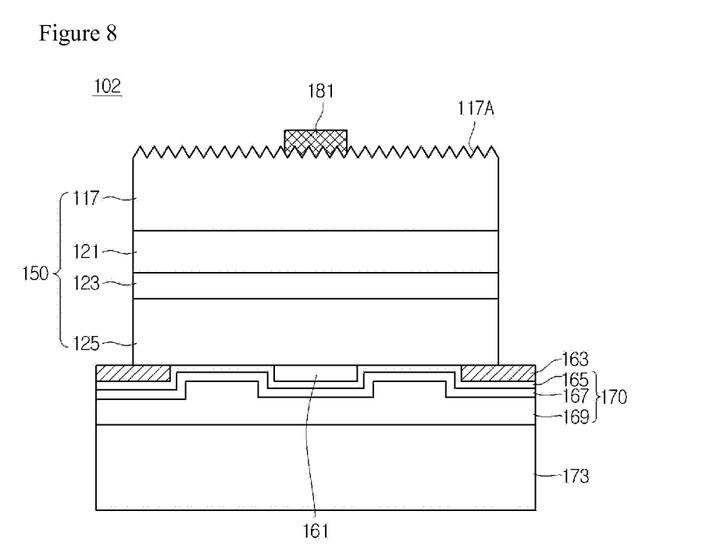
FIG. 8 is a sectional view showing a vertical-type light-emitting device according to the embodiment.

An insulating layer may be further formed on a surface of the light-emitting device 101 to prevent inter-layer short of the light emitting structure 150 and to prevent moisture from being infiltrated into the light-emitting device FIG. 8 is a vertical-type light-emitting device according to the embodiment.

As shown in FIG. 8, a current blocking layer 161, a channel layer 163, and a second electrode 170 are provided under the light emitting structure 150 corresponding to that of the embodiment shown in FIG. 7. The current blocking layer 161 may include at least one of $SiO_2$, $SiO_x$, $SiO_xN_y$, $Si_3N_4$, $Al_2O_3$, and $TiO_2$. At least one current blocking layer may be formed between the light emitting structure 150 and the second electrode 170.

The current blocking layer 161 is arranged corresponding to a first electrode 181 provided on the first conductive semiconductor layer 117 in a thickness direction of the light emitting structure 150. The current blocking layer 161 blocks current supplied from the second electrode 170 and spreads the current to a different path.

The channel layer 163 is formed along a peripheral portion of a bottom surface of the second conductive semiconductor layer 125, and may have a ring shape, a loop shape, or a frame shape. The channel layer 163 may include at least one of ITO, IZO, IZTO, IAZO, IGZO, IGTO, AZO, ATO, $SiO_2$, $SiO_xN_y$, $Al_2O_3$, and $TiO_2$. An inner portion of the channel layer 163 is provided under the second conductive semiconductor layer 125, and an outer portion of the channel layer 163 is provided out of a sidewall of the light emitting structure 150.

The second electrode 170 may be formed under the second conductive semiconductor layer 125. The second electrode 170 may include a plurality of conductive layers 165, 167, and 169.

The second electrode 170 includes an ohmic contact layer 165, a reflective layer 167, and a bonding layer 169. The ohmic contact layer 165 may include a lower conductive material such as ITO, IZO, IZTO, IAZO, IGZO, IGTO, AZO, or ATO, or include metal such as Ni, or Ag. The reflective layer 167 is formed under the ohmic contact layer 165. The reflective layer 167 may be formed in a structure including at least one layer including a material selected from the group consisting of Ag, Ni, Al, Rh, Pd, Ir, Ru, Mg, Zn, Pt, Au, Hf, and the combination thereof. The reflective layer 167 may make contact with the bottom surface of the second conductive semiconductor layer 125. The reflective layer 167 may include metal, or a low conductive material such as ITO for the ohmic contact, but the embodiment is not limited thereto.

The bonding layer 169 is formed under the reflective layer 167. The bonding layer 169 may include barrier metal or bonding metal. For example, the bonding layer 1169 may include at least one of Ti, Au, Sn, Ni, Cr, Ga, In, Bi, Cu, Ag, Ta, and the alloy of materials selected from among Ti, Au, Sn, Ni, Cr, Ga, In, Bi, Ag, and Ta.

A support member 173 is formed under the bonding layer 169. The support member 173 may include a conductive member. The support member 173 may include a conductive material such as copper (Cu), gold (Au), nickel (Ni), molybdenum (Mo), copper-tungsten (Cu—W), a carrier wafer (e.g., Si, Ge, GaAs, ZnO, or SiC). Alternatively, the support member 173 may be realized using a conductive sheet.

A light extraction structure 117A, such as a roughness, may be formed on the top surface of the first conductive semiconductor layer 117, The outer portion of the channel layer 163 is exposed to an outside of the sidewall of the light emitting structure 150, and the inner portion of the channel layer 163 may make contact with the bottom surface of the second conductive semiconductor layer 125.

Accordingly, a lighting emitting device 102, having a vertical-type electrode structure including the first electrode 181 formed on the light emitting structure 150 and the support member 173 formed under the light emitting structure 150 can be fabricated.

Figure 9:
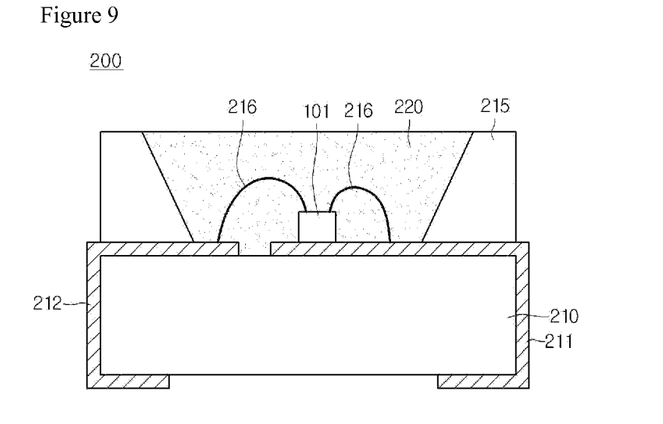
FIG. 9 is a sectional view showing a light-emitting device package according to the embodiment.

FIG. 9 is a sectional view showing a light-emitting device package according to the embodiment.

Referring to FIG. 9, a light-emitting device package 200 includes a body 210, first and second lead electrodes 211 and 212 having at least portions provided in the body 210, the light-emitting device 101 electrically connected with the first and second lead electrodes 211 and 212 on the body 210, and a molding member 220 to surround the lateral-type light-emitting device 101 of FIG. 7 on the body 210

The body 210 may include a silicon material, a synthetic resin material, or a metallic material, The body 210 includes a reflective part 215 provided therein with a cavity and provided on a circumference thereof with an inclination surface when viewed from the top of the body 210.

The first and second lead electrodes 211 and 212 may be electrically isolated from each other, and may extend through an inner part of the body 210. In other words, portions of the first and second lead electrodes 211 and 212 are provided in the cavity, and the other portions of the first and second lead electrodes 211 and 212 may be provided outside the body 210.

The first and second lead electrodes 211 and 212 supply power to the light-emitting device 101, and reflect light emitted from the light-emitting device 101 to enhance light efficiency. In addition, the first and second lead electrodes 211 and 212 may discharge heat emitted from the light-emitting device 101 to the outside.

The light-emitting device 101 may be mounted on the body 210 or may be mounted on the first lead electrode 211 and/or the second lead electrode 212.

A wire 216 of the light-emitting device 101 may be electrically connected with the first electrode 211 or the second lead electrode 212, but the embodiment is not limited thereto.

The molding member 220 surrounds the light-emitting device 101 to protect the light-emitting device 101. In addition, the molding member 220 may include a phosphor, and the wavelength of the light emitted from the light-emitting device 101 may be changed by the phosphor.

The light-emitting device or the light-emitting device package according to the embodiment may be applied to a light unit. The light unit includes the structure in which a plurality of light-emitting devices or a plurality of light-emitting device packages are arrayed, the display devices shown in FIGS. 10 and 11, and the lighting device shown in FIG. 12, The light unit may include a lighting lamp, a signal lamp, a headlight of a vehicle, or an electric signboard.

Figure 10:
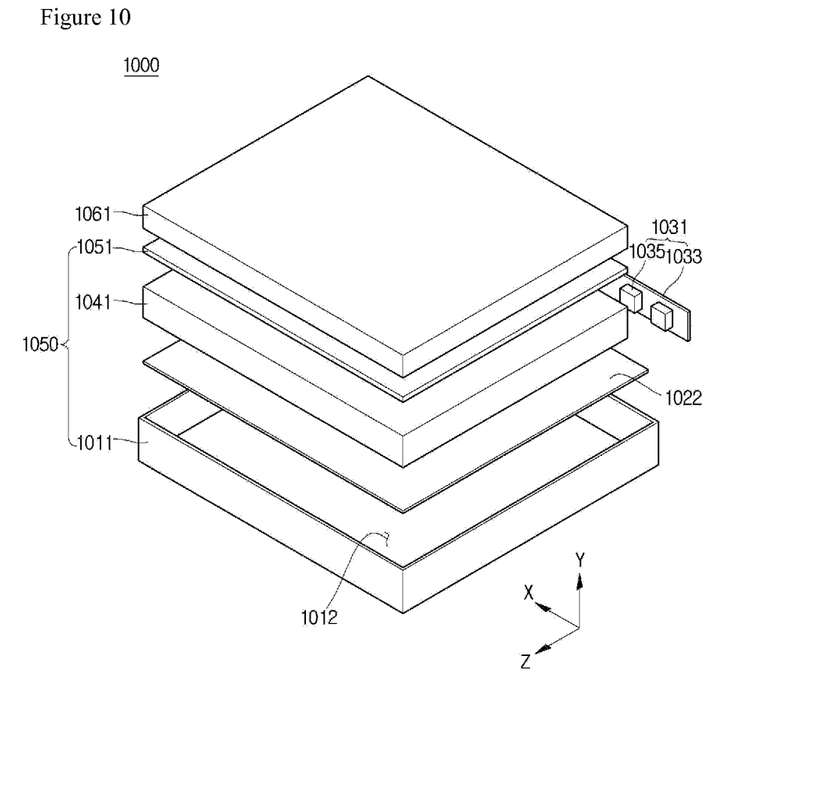
FIG. 10 is a view showing a display device according to the embodiment.

FIG. 10 is an exploded perspective view showing a display device according to the embodiment.

Referring to FIG. 10, a display device 1000 according to the embodiment may include a light guide plate 1041, a light emitting module 1031 to supply the light to the light guide plate 1041, a reflective member 1022 provided under the light guide plate 1041, an optical sheet 1051 provided on the light guide plate 1041, a display panel 1061 provided on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1011 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed on at least one side of the light guide plate 1041. The light emitting module 1031 serves as the light source of the display device.

At least one light emitting module 1031 is provided in the bottom cover 1011 to directly or indirectly supply the light from one side of the light guide plate 1041. The light emitting module 1031 may include a support member 1033 and light-emitting devices 1035 according to the embodiments. The light-emitting devices 1035 are arrayed on the support member 1033 while being spaced apart from each other by the predetermined interval. The support member 1033 may be a substrate or a heat radiation plate, but the embodiment is not limited thereto.

The substrate may include a printed circuit board (PCB) including a circuit pattern (not shown). In addition, the substrate may include a metal core PCB (MCPCB) or a flexible PCB (FPCB) as well as a typical PCB, but the embodiment is not limited thereto. The light-emitting device 1035 may be installed on the side of the bottom cover 1011 or on a heat dissipation plate. The light-emitting device 1035 may be realized using the light-emitting device according to the embodiment or a package having the light-emitting device according to the embodiment. In this case, a portion of the heat radiation plate may make a contact with the top surface of the bottom cover 1011.

In addition, the light-emitting devices 1035 are arranged on the support member 1033 such that a light exit surface of the light-emitting devices 1035 is spaced apart from the light guide plate 1041 by a predetermined interval, but the embodiment is not limited thereto. The light-emitting devices 1035 may directly or indirectly supply the light to a light incident surface, which is one side of the light guide plate 1041, but the embodiment is not limited thereto.

The reflective member 1022 may be provided under the light guide plate 1041. The reflective member 1022 reflects the light, which is incident onto the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto, The display panel 1061 displays information by a light passing through an optical sheet 1051. The display apparatus 1000 can be applied to various portable terminals, monitors of notebook computers, monitors or laptop computers, and televisions.

The optical sheet 1051 is provided between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display region, and the brightness enhanced sheet improves the brightness by reusing the lost light. In addition, a protective sheet may be provided on the display panel 1061, but the embodiment is not limited thereto.

The light guide plate 1041 and the optical sheet 1051 can be provided on the light path of the light emitting module 1031 as optical members, but the embodiment is not limited thereto.

Figure 11:
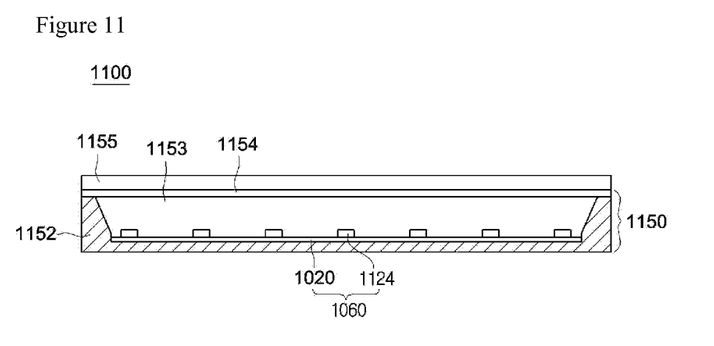
FIG. 11 is a view showing another example of a display device according to the embodiment.

FIG. 11 is a view showing another example of the display device having the light-emitting device according to the embodiment.

Referring to FIG. 11, the display apparatus 1100 includes a bottom cover 1152, a support member 1120 on which the light-emitting devices 1124 are arrayed, an optical member 1154, and a display panel 1155.

The support member 1120 and the light-emitting device 1124 may constitute the light emitting module 1160. The light-emitting device 1124 may be realized in the form of the light-emitting device according to the embodiment and a package having the light-emitting device according to the embodiment. The bottom cover 1152, at least one light emitting module 1160, and the optical member 1154 may constitute the light unit 1150. The bottom cover 1152 may include a receiving part 1153, but the embodiment is not limited thereto. The light emitting module 1160 includes the substrate 1120 and a plurality of light-emitting devices 1124 arranged on the substrate 1120.

The optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate may be omitted. The diffusion sheet diffuses the incident light, the horizontal and vertical sheets concentrate the incident light onto the display region, and the brightness enhanced sheet improves the brightness by reusing the lost light.

The optical member 1154 is provided on the light source module 1160. The optical member 1154 provides the light emitted from the light source module 1150 as a surface light source, or diffuses or concentrates the light.

Figure 12:
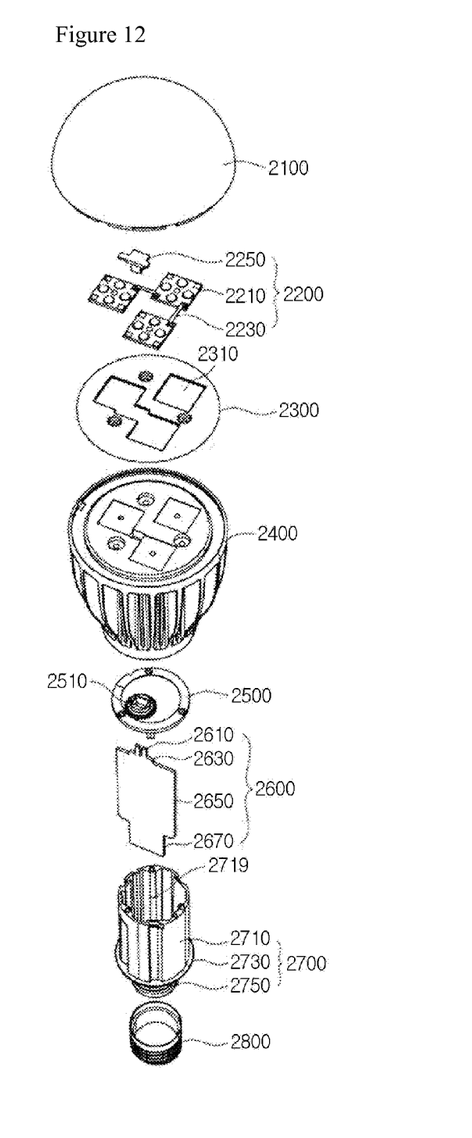
FIG. 12 is a view showing a lighting device according to the embodiment.

FIG. 12 is an exploded perspective view showing a lighting device according to the embodiment.

Referring to FIG. 12, the lighting device according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light-emitting device or the light-emitting device package according to the embodiment.

For example, the cover 2100 may have a blub shape, a hemisphere shape, a partially-open hollow shape. The cover 2100 may be optically coupled with the light source module 2200. The cover 2100 may be coupled with the radiator 2400. The cover 2100 may include a coupling part which is coupled with the radiator 2400.

The cover 2100 may include an inner surface coated with a milk-white paint having a diffusion agent. The cover 2100 may scatter and diffuse light from the light source module 2200 using the milk-white paint and discharge the light to the outside.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is provided at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with white color pigments. The member 2300 again reflects light, which is reflected by the inner surface of the cover 2100 and is returned to the light source module 2200, to the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner ease 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. The extension part 2670 may be electrically connected with the socket 2800 through a wire.

The inner case 2700 may include a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

According to the embodiment, in the light-emitting device, the method of fabricating the same, the light-emitting device package, and the lighting system, quantum efficiency can be improved at the high current density by superimposing wave functions of electrons and holes, which are provided at a conductive band and a valance band in a quantum well layer while facing each other, with each other.

The invention claimed is:

1. A light emitting device comprising:
a first conductive semiconductor layer;
an active layer on the first conductive semiconductor layer;
a blocking layer on the active layer; and
a second conductive semiconductor layer on the blocking layer,
wherein the active layer comprises a plurality of quantum well layers and a plurality of quantum barrier layers,
each quantum well layer comprises $In_xGa_yNIn_xGa_yN$ ($0.11 \leq x \leq 0.14$, $0 < x+y \leq 1$), and
wave functions of the quantum well layers facing each other in the active layer are superimposed with each other based on centers of the quantum well layers.

2. The light emitting device of claim 1, wherein the quantum well layer comprises $In_xAl_yGa_{1-x-y}N$ ($0 \leq X \leq 1$, $0 \leq y \leq 0.005$, $0 \leq x+y \leq 1$).

3. The light emitting device of claim 1, further comprising:
a first electrode on the first conductive semiconductor layer;
a second electrode on the second conductive semiconductor layer; and
an electrode layer disposed between the second conductive semiconductor layer and the second electrode.

4. The light emitting device of claim 1, further comprising a low conductive layer, a buffer layer, and a substrate that are sequentially provided under the first conductive semiconductor layer.

5. The light emitting device of claim 4, wherein the substrate is provided thereon with a plurality of protrusions.

6. The light emitting device of claim 1, further comprising:
a current blocking layer and a channel layer which are provided under the second conductive semiconductor layer;
a second electrode under the second conductive semiconductor layer, the current blocking layer, and the channel layer; and
a first electrode on the first conductive semiconductor layer.

7. The light emitting device of claim 1, wherein the quantum well layer has a lower conductive energy band and a lower valance energy band facing each other, the quantum barrier layer has a higher conductive energy band and a higher valance energy band of the active layer facing each other, and a wave function of a conducive band and a wave function of a valance band are superimposed with each other in each of the quantum well layer and the quantum barrier layer.

8. The light emitting device of claim 7, wherein a vertex region of the wave function of the conductive band having a highest existence probability of a hole is superimposed with a vertex region of the wave function of the valance band having a highest existence probability of an electron.

9. The light emitting device of claim 7, wherein positions of the wave function of the conductive band and the wave function of the valance band are shifted due to a content of indium (In).

10. The light emitting device of claim 7, wherein a vertex region of the wave function of the conductive band having a highest existence probability of a hole is superimposed with a vertex region of the wave function of the valance band having a highest existence probability of an electron in a vertical direction such that a shortest distance is formed between the vertex region of the wave function of the conductive band and the vertex region of the wave function of the valance band.

11. A light emitting device comprising:
a light emitting structure comprising a light emitting structure comprising a second conductive semiconductor layer, a blocking layer on the second conductive semiconductor layer, an active layer on the blocking layer, and a first conductive semiconductor layer on the active layer;
a first electrode on the light emitting structure; and
a second electrode under the light emitting structure,
wherein the active layer comprises a plurality of quantum well layers and a plurality of quantum barrier layers,
the quantum well layer has a lower conductive energy band and a lower valance energy band facing each other,
the quantum barrier layer has a higher conductive energy band and a higher valance energy band facing each other, and
a wave function of a conducive band and a wave function of a valance band are superimposed with each other in each of the quantum well layer and the quantum barrier layer.

12. The light emitting device of claim 11, wherein the quantum well layer comprises $In_xGa_yNin_xGa_yN$ ($0.11 \leq x \leq 0.14$, $0 < x+y \leq 1$).

13. The light emitting device of claim 11, wherein a vertex region of the wave function of the conductive band having a highest existence probability of a hole is superimposed with a vertex region of the wave function of the valance band having a highest existence probability of an electron.

14. The light emitting device of claim 11, wherein positions of the wave function of the conductive band and the wave function of the valance band are shifted due to a content of indium (In).

15. The light emitting device of claim 11, wherein a vertex region of the wave function of the conductive band having a highest existence probability of a hole is superimposed with a vertex region of the wave function of the valance band having a highest existence probability of an electron in a vertical direction such that a shortest distance is formed between the vertex region of the wave function of the conductive band and the vertex region of the wave function of the valance band.

16. The light emitting device of claim 11, wherein the quantum barrier layer comprises $In_xAl_yGa_{1-x-y}N$ ($0 \leq x \leq 1$, $0 \leq y \leq 0.005$, $0 \leq x+y \leq 1$).

17. The light emitting structure of claim 11, further comprising a light extraction structure on a top surface of the first semiconductor layer.

18. The light emitting structure of claim 11, wherein the second electrode comprises an ohmic contact layer, a reflective layer, and a bonding layer.

19. A light emitting device package comprising:
a body;
a light emitting device on the body; and
first and second lead electrodes electrically connected with the light emitting device,
wherein the light emitting device comprises a first conductive semiconductor layer, an active layer on the first conductive semiconductor layer, a blocking layer on the active layer, and a second conductive semiconductor layer on the blocking layer, and
wherein the active layer comprises a plurality of quantum well layers and a plurality of quantum barrier layers,
each quantum well layer comprises $In_xGa_yNIn_xGa_yN$ ($0.11 \leq x \leq 0.14$, $0 < x+y \leq 1$), and
wave functions of the quantum well layers facing each other in the active layer are superimposed with each other based on a centers of the quantum well layers.

* * * * *